(12) United States Patent
Huang

(10) Patent No.: US 8,111,107 B2
(45) Date of Patent: Feb. 7, 2012

(54) CHARGE PUMP CONTROL SCHEME

(75) Inventor: Ming-Chieh Huang, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 27 days.

(21) Appl. No.: 12/831,338

(22) Filed: Jul. 7, 2010

(65) Prior Publication Data

US 2012/0007682 A1    Jan. 12, 2012

(51) Int. Cl.
*H03L 7/085* (2006.01)
*G05F 1/10* (2006.01)

(52) U.S. Cl. ............. 331/17; 331/57; 327/157; 327/536

(58) Field of Classification Search ............... 331/16, 331/17, 57; 327/148, 157, 536; 375/374
See application file for complete search history.

(56) References Cited

U.S. PATENT DOCUMENTS

| 5,136,260 | A | * | 8/1992 | Yousefi-Elezei | 331/17 |
| 5,689,213 | A | * | 11/1997 | Sher | 331/57 |
| 5,828,258 | A | * | 10/1998 | Ooishi et al. | 327/291 |
| 6,492,862 | B2 | * | 12/2002 | Nakahara | 327/536 |

* cited by examiner

*Primary Examiner* — Levi Gannon

(74) *Attorney, Agent, or Firm* — Lowe, Hauptman, Ham & Berner, LLP

(57) ABSTRACT

An integrated circuit includes a charge pump having a voltage output. A voltage level detector is arranged to receive the voltage output, wherein the voltage level detector provides a first enable signal for the charge pump. A ring oscillator has multiple inverters. The ring oscillator is coupled to the charge pump. A counter control circuit is configured to provide a control signal for adjusting a frequency of the ring oscillator based on the first enable signal of the voltage level detector.

20 Claims, 8 Drawing Sheets

CHARGE PUMP CONTROL SCHEME

TECHNICAL FIELD

The present disclosure relates generally to an integrated circuit, and more particularly, a charge pump.

BACKGROUND

In known charge pump circuits, the pump driving capability can degrade due to low power supply voltage (VDD), low temperature, or high threshold voltage (Vt) of Metal-Oxide-Semiconductor (MOS) transistors with thick gate oxide. More specifically, these factors can adversely affect a charge pump from achieving its target voltage level and current capability of its output.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
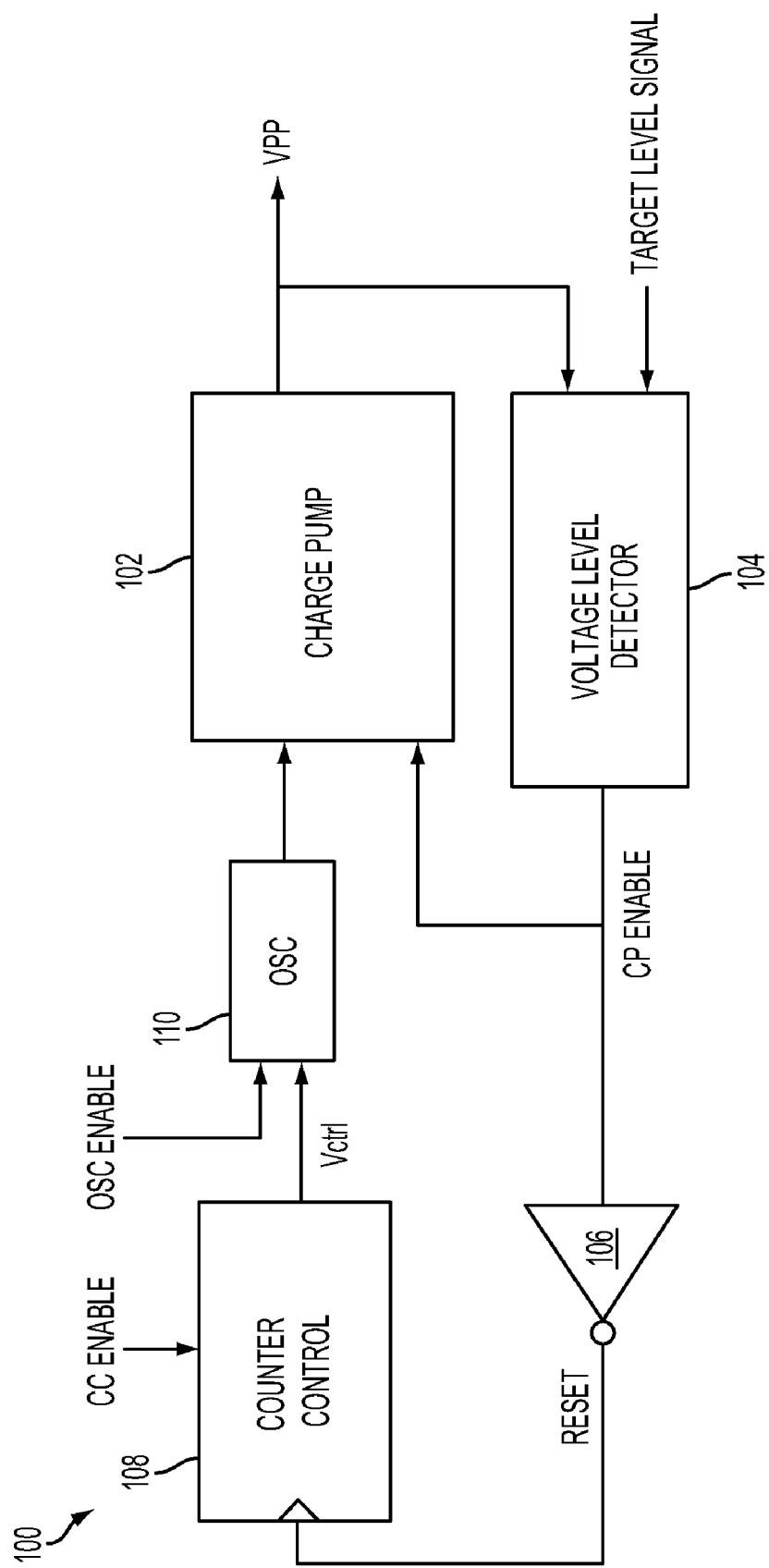
FIG. 1 is a schematic diagram showing an exemplary charge pump control scheme according to one embodiment.

FIG. 1 is a schematic diagram showing an exemplary charge pump control scheme according to one embodiment. The charge pump 102 has an output voltage (VPP) that is sent to the voltage level detector 104, which compares VPP to the target level signal. When VPP is less than the target level (also having less current output than expected), a charge pump (CP) enable signal is asserted to enable the charge pump 102 in order to bring VPP to the target level. The CP enable signal is inverted through the inverter 106 and monitored by the counter control circuit 108 that counts how many clock cycles have passed since the reset signal was not asserted (or how long the CP enable signal has been asserted).

After the number of clock cycles reaches a threshold number indicating how long VPP has been below the target level, the counter control circuit 108 sends a control signal (Vctrl) to an oscillator 110 (e.g., a ring oscillator) to adjust its frequency, e.g., increase the frequency. When the oscillator 110 increases its frequency, the charge pump 102 supplies electric charge faster to help raise VPP to the target level. After the voltage level detector 104 detects that VPP reached or exceeded the target level, the CP enable signal can be disabled.

The counter control circuit 108 can have different operation modes, e.g., enabled or disabled, selected based on the counter control (CC) enable signal. When the counter control circuit 108 is disabled, a default control signal can be sent to the oscillator 110 to keep it operating at a default frequency. The oscillator can be also enabled or disabled by the oscillator (OSC) enable signal.

Figure 2:
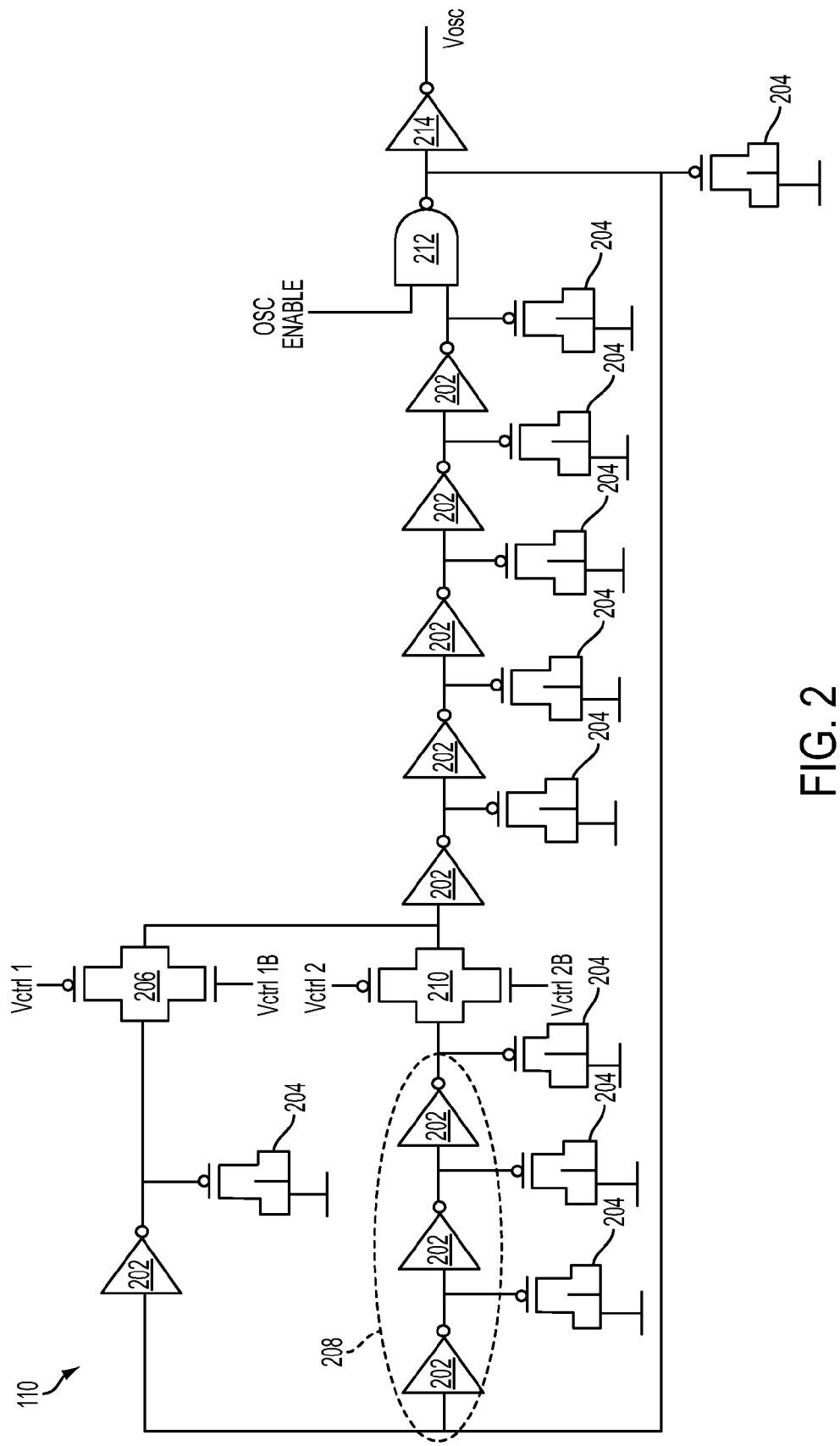
FIG. 2 is a schematic diagram showing an exemplary ring oscillator for the charge pump control scheme in FIG. 1 according to one embodiment.

FIG. 2 is a schematic diagram showing an exemplary ring oscillator for the charge pump control scheme in FIG. 1 according to one embodiment, where the oscillator 110 is a ring oscillator with multiple inverters 202 forming the ring. Capacitors 204 in between inverters 202 are used to control the timing and frequency of the oscillator 110. Pass gates 206 and 210 are coupled to different paths, i.e., the pass gate 206 is coupled to a path having only one inverter 202 (path I), while the pass gate 210 is coupled to another path having three inverters 208 (path II).

By using control signals Vctrl 1 and Vctrl 2 (e.g., derived from Vctrl) coupled to the pass gates 206 and 210, one path can be selected for the operation of the oscillator 110. Since the ring formed with path I has a lesser number of inverters than the ring formed with path II, the ring using path I has a higher oscillator frequency than the ring using path II. When the counter control circuit 108 in FIG. 1 decides that VPP has been below the target level over a threshold number of clock cycles, it can send the control signal Vctrl to decrease the number of inverters 202 used for the oscillator 110.

Figure 3:
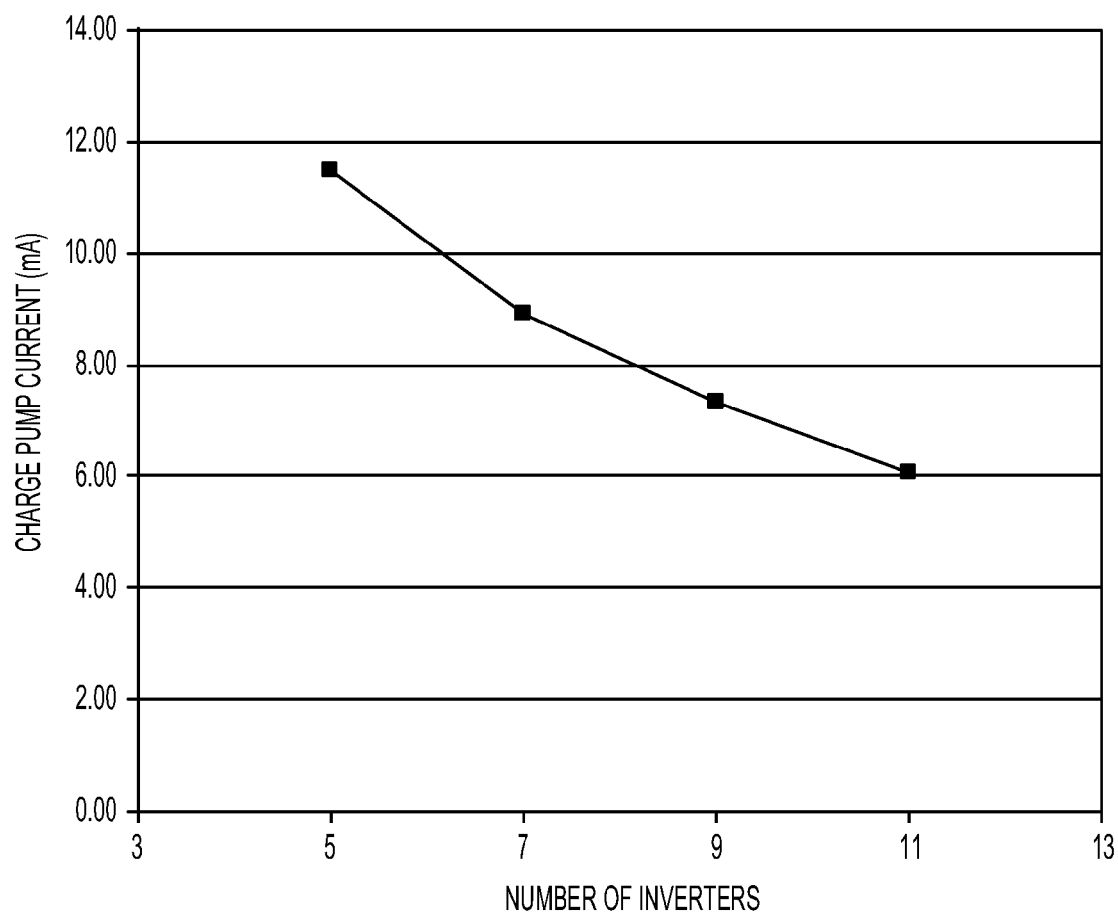
FIG. 3 is a plot showing the output current of the exemplary charge pump control scheme in FIG. 1 when the number of inverters in the ring oscillator is changed according to one embodiment.

FIG. 3 is a plot showing the output current of the exemplary charge pump control scheme in FIG. 1 when the number of inverters 202 in the (ring) oscillator 110 is changed according to one embodiment. The plot shows that as the number of inverters 202 used in the oscillator 110 increases, the output current from the charge pump 102 decreases. For example, the current is about 11.6 mA with 5 inverters, while the current is about 6 mA with 11 inverters. (The output voltage VPP will change with the output current.)

Figure 4:
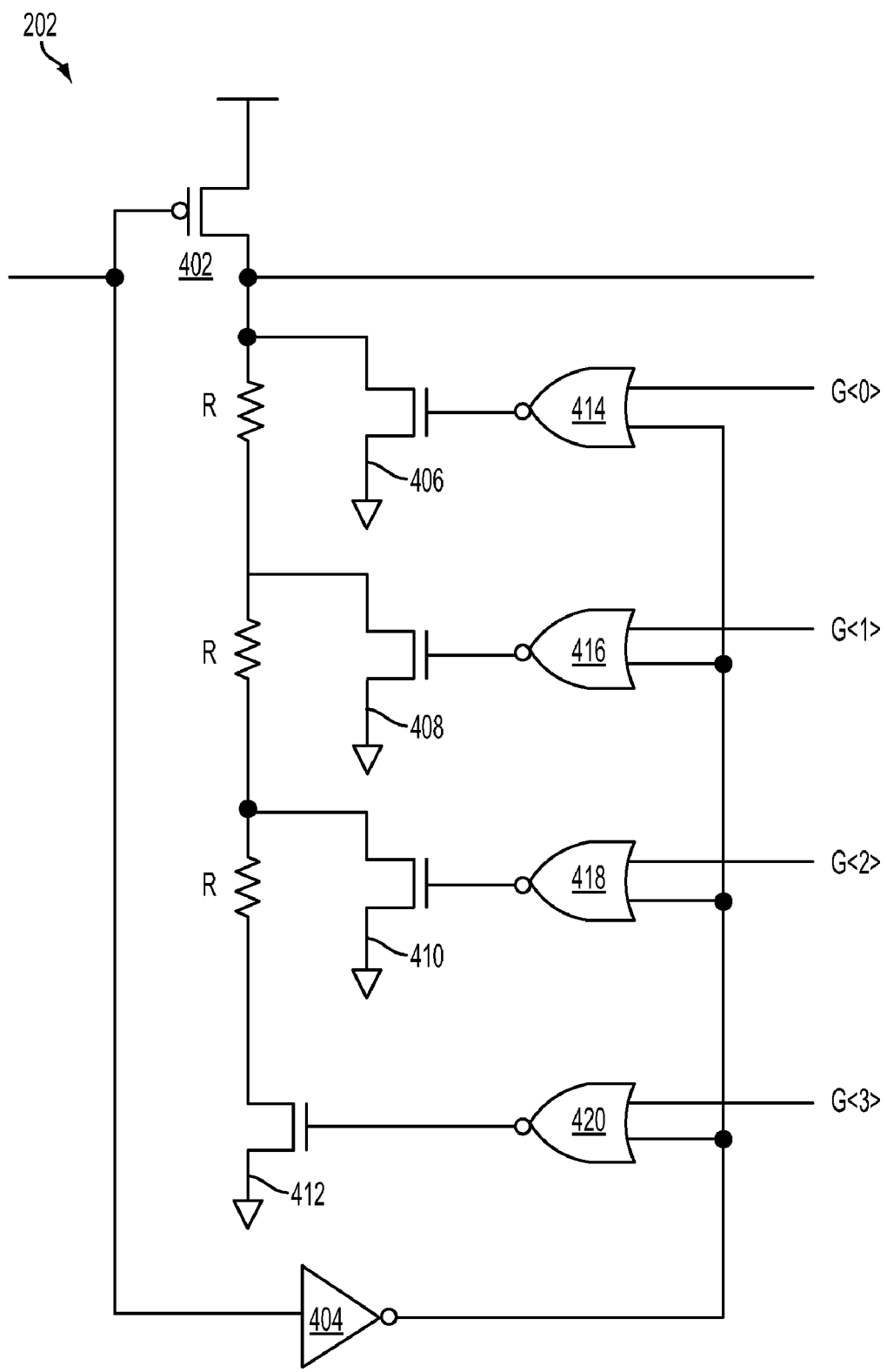
FIG. 4 is a schematic diagram showing an exemplary inverter used in the ring oscillator for the charge pump control scheme in FIG. 1 according to one embodiment.

FIG. 4 is a schematic diagram showing an exemplary inverter 202 used in the (ring) oscillator 110 for the charge pump control scheme in FIG. 1 according to one embodiment. The inverter 202 has multiple resistors R in series, coupled to the pull-up PMOS transistor 402 of the inverter 202. Pull-down NMOS transistors 406, 408, 410, and 412 are coupled to the end or in between the resistors R. (The resistance of each resistor can be different from the other resistors in some embodiments.) The NOR gates 414, 416, 418, and 420 receive inputs from the inverter 404 (that is coupled to the input of the inverter 202), as well as from control signal G<0>-G<3> (that can be derived from the control signal Vctrl out of the control circuit 108).

If G<0>-G<3> are (0 1 1 1), the NMOS transistor 406 is enabled and no additional resistors are in the pull-down path of the inverter 202. If G<0>-G<3> are (1 0 1 1), the NMOS transistor 408 is enabled and one additional resistor is in the pull-down path. If G<0>-G<3> are (1 1 0 1), the NMOS transistor 410 is enabled and two additional resistors are in the pull-down path. If G<0>-G<3> are (1 1 1 0), the NMOS transistor 412 is enabled and three additional resistors are in the pull-down path. Therefore, the inverter 202's pull-down resistance can be controlled, which affects the oscillator frequency. For example, the oscillator frequency increases with lower resistance, thus increasing VPP and current of the charge pump 102.

Figure 5:
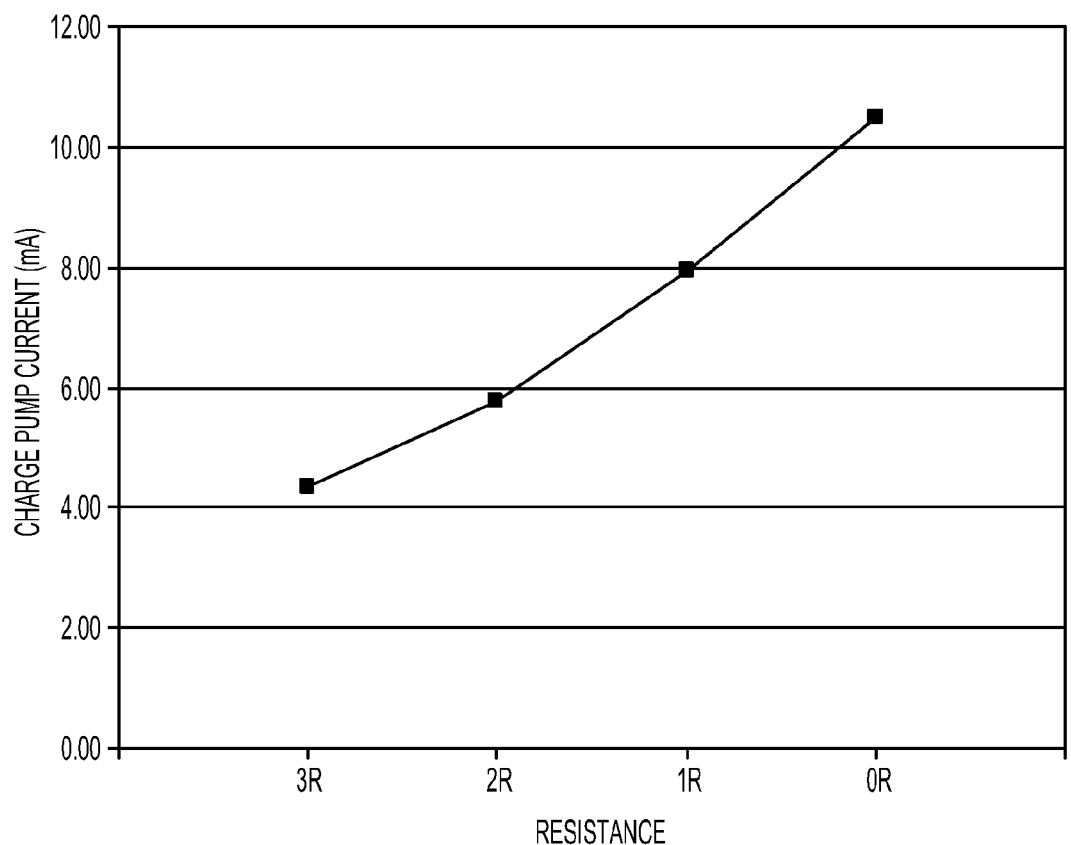
FIG. 5 is a plot showing the output current of the exemplary charge pump control scheme in FIG. 1 when the resistance of inverters in the ring oscillators is changed according to one embodiment.

FIG. 5 is a plot showing the output current of the exemplary charge pump control scheme in FIG. 1 when the resistance of inverters 202 in the (ring) oscillators 110 is changed according to one embodiment. With lower resistance, the output current of the charge pump 102 is increased. For example, when the additional resistance is 3R (R is the resistance of one resistor in FIG. 4), the charge pump output current is about 4.3 mA. When the additional resistance is OR, the charge pump output current is about 10.5 mA.

Figure 6:
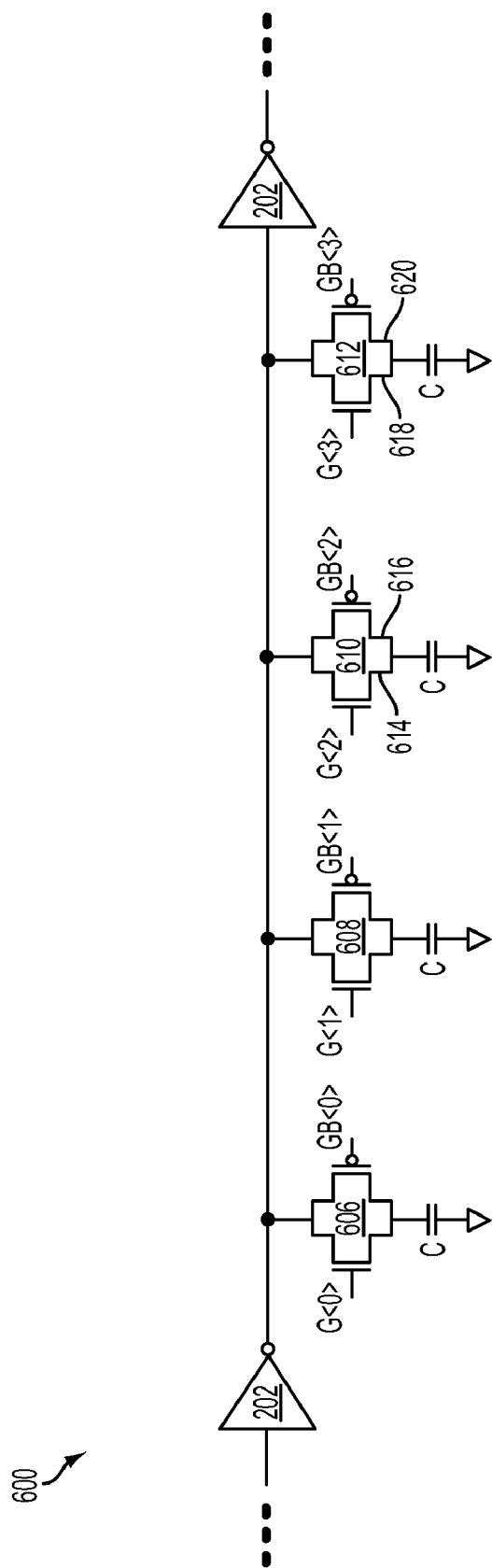
FIG. 6 is a schematic diagram showing an exemplary capacitors coupled in between inverter used in the ring oscillator for the charge pump control scheme in FIG. 1 according to one embodiment.

FIG. 6 is a schematic diagram showing exemplary capacitors coupled in between inverter used in the ring oscillator for the charge pump control scheme in FIG. 1 according to one embodiment. The inverter 202 of the (ring) oscillator 110 has its output coupled to pass gates 606, 608, 610, and 612, instead of MOS capacitor 204 (shown in FIG. 2). Each pass gate is coupled to a capacitor C. The pass gates 606, 608, 610, and 612 have inputs from the control signal G<0>-G<3>, which can be derived from the control signal Vctrl out of the control circuit 108.

If any one of G<0>-G<3> is a logical 1, the corresponding pass gate is enabled to connect one capacitor (1C) to the inverter output. If any two of G<0>-G<3> are a logical 1, their pass gates are enabled to connect two capacitors (2C) to the inverter output. If any three of G<0>-G<3> are a logical 1, their pass gates are enabled to connect three capacitors (3C) to the inverter output. If all four of G<0>-G<3> are a logical 1, all the pass gates are enabled to connect four capacitors (4C) to the inverter output. Therefore, the inverter capacitance loading of the oscillator 110 can be controlled, which affects the oscillator frequency. For example, the oscillator frequency increases with lower capacitance, thus increasing VPP and current of the charge pump 102.

Figure 7:
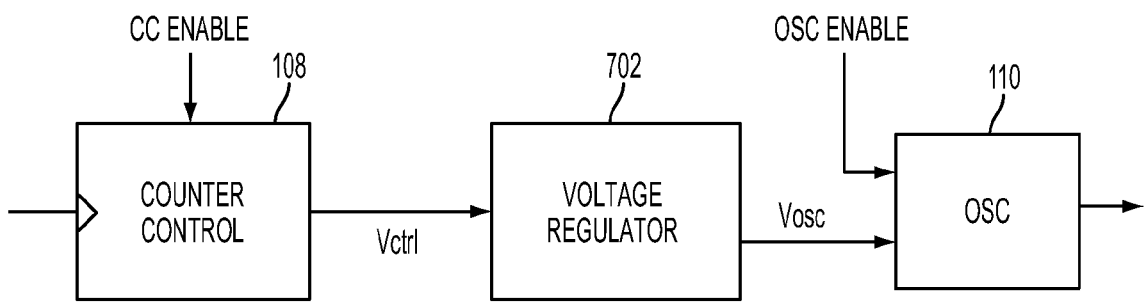
FIG. 7 is a schematic diagram showing a voltage regulator for the oscillator used in an exemplary charge pump control scheme in FIG. 1 according to one embodiment.

FIG. 7 is a schematic diagram showing a voltage regulator 702 for the oscillator 110 used in an exemplary charge pump control scheme in FIG. 1 according to one embodiment. The control signal Vctrl from the counter control 108 is coupled to the voltage regulator 702. The voltage regulator 702 adjusts its voltage output Vosc (power supply voltage of the oscillator 110). By increasing Vosc that is supplied to the oscillator 110, the oscillator's frequency increases, thus the charge pump 102 has higher VPP and output current.

Figure 8:
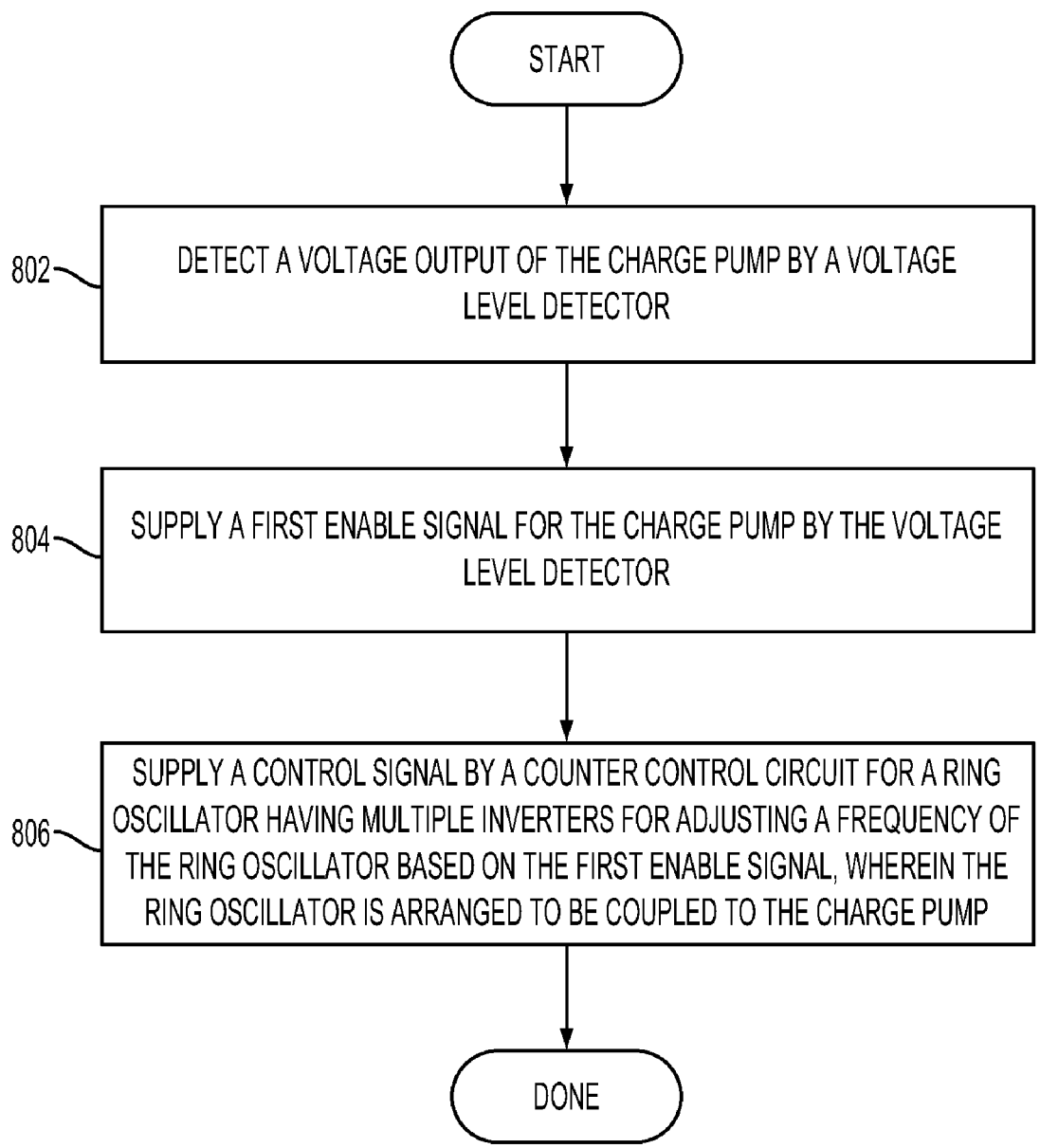
FIG. 8 is a flowchart for a method for the exemplary charge pump control scheme in FIG. 1 according to one embodiment.

FIG. 8 is a flowchart for a method for the exemplary charge pump control scheme in FIG. 1 according to one embodiment. At step 802, a voltage output (e.g., VPP) of the charge pump, e.g., 102, is detected by a voltage level detector, e.g., 104. At step 804, a first enable signal, e.g., CP enable signal, is supplied for the charge pump, e.g., 102, by the voltage level detector, e.g., 104. At step 806, a control signal, e.g., Vctrl, is supplied by a counter control circuit, e.g., 108, for a ring oscillator, e.g., 110, having multiple inverters, e.g., 202, for adjusting a frequency of the ring oscillator, e.g., 110, based on the first enable signal, e.g., CP enable signal, wherein the ring oscillator, e.g., 110, is coupled to the charge pump, e.g., 102.

The method can further include increasing the frequency of the ring oscillator, e.g., 110, when the first enable signal, e.g., CP enable signal, is asserted over a threshold number of clock cycles. The method can further include adjusting a number of inverters, e.g., 202, used in the ring oscillator, e.g., 110, based on the control signal, e.g., Vctrl. Adjusting the number of inverters, e.g., 202, can include selecting one path among at least two paths using pass gates, e.g., 206 and 210, each path having a different number of inverters, e.g., 202.

The method can further include adjusting a resistance in at least one of the multiple inverters, e.g., 202, based on the control signal, e.g., Vctrl. The method can further include adjusting a capacitance coupled in between the multiple inverters, e.g., 202, based on the control signal, e.g., Vctrl. The method can further include supplying a power supply voltage, Vosc, by a voltage regulator, e.g., 702, to the ring oscillator, e.g., 110, based on the control signal, e.g., Vctrl. The method can further include selecting an operation mode with the input of a second enable signal, e.g., CC enable signal, to the counter control circuit, e.g., 108.

An integrated circuit according to one embodiment includes a charge pump having a voltage output. A voltage level detector is arranged to receive the voltage output, wherein the voltage level detector provides a first enable signal for the charge pump. A ring oscillator has multiple inverters. The ring oscillator is coupled to the charge pump. A counter control circuit is configured to provide a control signal for adjusting a frequency of the ring oscillator based on the first enable signal of the voltage level detector.

A method for a charge pump in one embodiment includes detecting a voltage output of the charge pump by a voltage level detector. The method further includes supplying a first enable signal for the charge pump by the voltage level detector. The method further includes supplying a control signal by a counter control circuit for a ring oscillator having multiple inverters for adjusting a frequency of the ring oscillator based on the first enable signal, wherein the ring oscillator is coupled to the charge pump.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiments show exemplary steps, but they are not necessarily required to be performed in the order shown. Steps may be added, replaced, changed order, and/or eliminated as appropriate, in accordance with the spirit and scope of embodiment of the disclosure.

What is claimed is:

1. An integrated circuit, comprising:
a charge pump having a voltage output;
a voltage level detector arranged to receive the voltage output and provide a first enable signal for the charge pump;
a ring oscillator having a plurality of inverters, wherein the ring oscillator is coupled to the charge pump; and
a counter control circuit configured to provide a control signal for adjusting a frequency of the ring oscillator based on the first enable signal of the voltage level detector.

2. The integrated circuit of claim 1, wherein the counter control circuit is configured to increase the frequency of the ring oscillator when the first enable signal is asserted for more than a threshold number of clock cycles.

3. The integrated circuit of claim 1, wherein the ring oscillator is configured to adjust a number of said inverters used in the ring oscillator based on the control signal.

4. The integrated circuit of claim 1, wherein the ring oscillator includes pass gates arranged to select one path from among at least two paths, each path having a different number of said inverters.

5. The integrated circuit of claim 1, wherein the ring oscillator is configured to adjust a resistance in at least one of the inverters based on the control signal.

6. The integrated circuit of claim 1, wherein at least one of the inverters includes a plurality of resistors coupled in series and a plurality of NMOS transistors coupled to junctions between adjacent said resistors.

7. The integrated circuit of claim 6, wherein the at least one inverter further includes a plurality of NOR gates coupled to respective gates of the NMOS transistors and the control signal is arranged to enable one of the NMOS transistors.

8. The integrated circuit of claim 1, further comprising at least one capacitor coupled to a junction between a pair of adjacent said inverters, wherein the ring oscillator is configured to adjust a capacitance of said at least one capacitor based on the control signal.

9. The integrated circuit of claim 1, wherein the ring oscillator includes at least one capacitor that is coupled to a junction between adjacent said inverters, and the control signal is configured to enable the at least one capacitor via a pass gate.

10. The integrated circuit of claim 1, further comprising a voltage regulator configured to receive the control signal from the counter control circuit and supply a power supply voltage to the ring oscillator based on the control signal.

11. The integrated circuit of claim 1, wherein the counter control circuit is configured to select an operation mode in response to a second enable signal at an input of the counter control circuit.

12. A method for operating a charge pump, said method comprising:
    detecting a voltage output of the charge pump by a voltage level detector;
    supplying a first enable signal generated by the voltage level detector to the charge pump; and
    supplying a control signal generated by a counter control circuit to a ring oscillator having a plurality of inverters for adjusting a frequency of the ring oscillator based on the first enable signal, wherein the ring oscillator is coupled to the charge pump.

13. The method of claim 12, further comprising increasing the frequency of the ring oscillator when the first enable signal is asserted for more than a threshold number of clock cycles.

14. The method of claim 12, further comprising adjusting a number of said inverters used in the ring oscillator based on the control signal.

15. The method of claim 14, wherein said adjusting the number of said inverters used in the ring oscillator comprises selecting one path from among at least two paths using pass gates, each path having a different number of said inverters.

16. The method of claim 12, further comprising adjusting a resistance in at least one of the inverters based on the control signal.

17. The method of claim 12, further comprising adjusting a capacitance of a capacitor, which is coupled to a junction between adjacent ones of the inverters, based on the control signal.

18. The method of claim 12, further comprising supplying a power supply voltage from a voltage regulator to the ring oscillator based on the control signal.

19. The method of claim 12, further comprising selecting an operation mode in response to a second enable signal at an input of the counter control circuit.

20. An integrated circuit, comprising:
    a charge pump having a voltage output;
    a voltage level detector arranged to receive the voltage output and provide a first enable signal for the charge pump;
    a ring oscillator having a plurality of inverters, wherein the ring oscillator is coupled to the charge pump and includes a plurality of pass gates arranged to select one path among at least two paths, each path having a different number of said inverters; and
    a counter control circuit configured to provide a control signal for increasing a frequency of the ring oscillator by reducing the number of said inverters connected in the ring oscillator when the first enable signal is asserted for more than a threshold number of clock cycles.

* * * * *